United States Patent
Zou

(10) Patent No.: US 10,057,689 B2
(45) Date of Patent: Aug. 21, 2018

(54) SILICON SPEAKER

(71) Applicant: GOERTEK INC., WeiFang (CN)

(72) Inventor: Quanbo Zou, WeiFang (CN)

(73) Assignee: GOERTEK INC., Weifang (CN)

( * ) Notice: Subject to any disclaimer, the term of this patent is extended or adjusted under 35 U.S.C. 154(b) by 0 days.

(21) Appl. No.: 15/304,058

(22) PCT Filed: Aug. 26, 2014

(86) PCT No.: PCT/CN2014/085206
§ 371 (c)(1),
(2) Date: Oct. 13, 2016

(87) PCT Pub. No.: WO2016/029358
PCT Pub. Date: Mar. 3, 2016

(65) Prior Publication Data
US 2017/0041717 A1    Feb. 9, 2017

(51) Int. Cl.
*H04R 19/00* (2006.01)
*B81C 1/00* (2006.01)
(Continued)

(52) U.S. Cl.
CPC ......... *H04R 19/005* (2013.01); *B81B 3/0021* (2013.01); *B81C 1/00158* (2013.01);
(Continued)

(58) Field of Classification Search
None
See application file for complete search history.

(56) References Cited

U.S. PATENT DOCUMENTS

2006/0148137 A1    7/2006  Hartzell et al.
2012/0148071 A1*   6/2012  Dehe .................. H04R 1/005
                                                 381/116
(Continued)

FOREIGN PATENT DOCUMENTS

CN    102685655 A    9/2012
CN    103209377 A    7/2013
(Continued)

OTHER PUBLICATIONS

International Search Report for International Patent Application No. PCT/CN2014/085206 filed on Aug. 26, 2014.
(Continued)

*Primary Examiner* — Curtis Kuntz
*Assistant Examiner* — Kenny Truong

(57) ABSTRACT

The present invention provides a silicon speaker comprising an MEMS acoustoelectric chip and a PCB substrate, wherein the MEMS acoustoelectric chip comprises a corrugated diaphragm on a silicon substrate; and one side surface of the MEMS acoustoelectric chip is metalized, and the metalized side surface of the MEMS acoustoelectric chip is connected with the PCB substrate. The corrugated diaphragm is electrically conductive and interconnected with metal paths on MEMS acoustoelectric chip, which is led out to a first PCB metal path as one electrode. A second PCB metal path below the MEMS chip forms another electrode of the electrostatic actuator. The silicon speaker provided by the present invention lowers manufacturing costs of the speaker, and allows the diaphragm to generate high and repeatable/reliable sound pressure upon large displacements so as to improve the sounding effects of the speaker.

9 Claims, 2 Drawing Sheets

(51) Int. Cl.
   *B81B 3/00*   (2006.01)
   *H04R 7/14*   (2006.01)
   *H04R 19/02*  (2006.01)

(52) U.S. Cl.
   CPC ............... *H04R 7/14* (2013.01); *H04R 19/02* (2013.01); *B81B 2201/0257* (2013.01); *B81B 2203/0127* (2013.01); *B81B 2207/012* (2013.01); *B81B 2207/07* (2013.01); *H04R 2201/003* (2013.01)

(56) References Cited

U.S. PATENT DOCUMENTS

| | | | | |
|---|---|---|---|---|
| 2013/0228937 | A1* | 9/2013 | Ehrenpfordt | H04R 19/005 257/778 |
| 2014/0001584 | A1* | 1/2014 | Liu | B81C 1/00158 257/419 |
| 2014/0133687 | A1 | 5/2014 | Lee | |
| 2014/0291787 | A1* | 10/2014 | Lan | H04R 19/005 257/416 |
| 2015/0198493 | A1* | 7/2015 | Kaelberer | G01P 15/0802 73/718 |

FOREIGN PATENT DOCUMENTS

| CN | 103313172 A | 9/2013 |
|---|---|---|
| CN | 203675306 U | 6/2014 |

OTHER PUBLICATIONS

Office Action from Chinese Patent Office for Application No. 201480003819.1, dated Apr. 21, 2017.

* cited by examiner

SILICON SPEAKER

CROSS-REFERENCE TO RELATED APPLICATION

The present specification is a U.S. National Stage of International Patent Application No. PCT/CN2014/085206, filed on Aug. 26, 2014, the entire contents of which are incorporated herein by reference.

TECHNICAL FIELD

The present invention relates to the technical field of acoustoelectric conversion, more specifically, to a silicon speaker.

BACKGROUND ART

As a common acoustic-electric transducer for converting electrical power into acoustic energy, the speaker is crucial in the sounding system. There is a variety of speakers, by which audio cones or diaphragms vibrate and resonate with the surrounding air to make sound through electromagnetic effect, piezoelectric effect or electrostatic effect. Thus, it is difficult to imagine how to enjoy wonderful sounding effects without the speaker.

Currently none of the commercial speakers is manufactured by wafer process or MEMS technology. While conventional speakers have been struggling in further scaling-down as requested by main-stream consumer customers, MEMS speakers on the other hand which is expected to play an important role in further miniaturized speaker market, has encountered fabrication cost problem in making large enough diaphragm for sufficient sound level output.

On one hand, the prior MEMS speaker is manufactured by wafer process and magnet integration, which makes the manufacturing process of the speaker extremely complicated and costly. Besides, the connecting pieces for connecting respective components of the speaker is mostly made of fragile materials/structures which, however, are unable to bear large deformation, thereby deteriorating the quality and service life of the speaker.

On the other hand, the prior MEMS speaker is a miniaturized digital speaker which requires a complicated high voltage integrated circuit (MEMS) to drive itself, while the diaphragm is susceptible to the impact from the digital switch of the digital miniaturized speaker, thereby reliability and service life might be big concerns.

Generally speaking, the prior speaker has the following problems:

1. Conventional speaker technologies have encountered challenges in further size-down and cost-down as requested in most of the consumer market.
2. The application of MEMS technology to the speaker seems struggling with fabrication cost and reliability issues.
3. The manufacturing cost of the MEMS speaker is kept high due to the complicated wafer process.

SUMMARY OF THE INVENTION

In view of the above problems, one object of the present invention is to provide a silicon speaker which allows the diaphragm to generate high and repeatable/reliable sound pressure upon large displacements so as to improve the sounding effects of the speaker, meanwhile, the manufacturing cost of the speaker is lowered.

The present invention provides a silicon speaker comprising an MEMS acoustoelectric chip and a PCB substrate, wherein the MEMS acoustoelectric chip comprises a corrugated diaphragm on a silicon substrate; and one side surface of the MEMS acoustoelectric chip is metalized, and the metalized side surface of the MEMS acoustoelectric chip is connected with the PCB substrate.

Wherein, metal paths are provided on the PCB substrate.

Wherein, a dielectric protrusion is provided at the center of the corrugated diaphragm.

Wherein, the corrugated diaphragm has high-aspect-ratio corrugation for stress relief.

Wherein the corrugated diaphragm has at least one layer of conductive material therein.

Wherein the MEMS acoustoelectric chip is flip-chip mounted on the PCB substrate with flux-less process.

Wherein, the PCB substrate is provided with an IC driver and/or a flip-chip thereon.

Wherein, the silicon speaker further comprises a sealing cover which is attached onto the PCB substrate.

Wherein, when the sealing cover and the substrate form the back chamber of the silicon speaker, the opening for transmitting sounds of the silicon speaker is provided at the bottom of the silicon speaker.

Wherein, a through hole is provided on the PCB substrate, and the through hole is the opening for transmitting sounds of the silicon speaker.

Wherein, when the sealing cover and the PCB substrate form a front chamber of the silicon speaker, the opening for transmitting sounds of the silicon speaker is provided at the top of the silicon speaker or on the side surface of the silicon speaker on the sealing cover.

The silicon speaker according to the present invention allows the corrugated diaphragm to generate high and repeatable/reliable sound pressure upon large displacements, thereby improving the sounding effects of the speaker, while the manufacturing costs of the speaker can be lowered.

In order to achieve the above and related objects, one or more aspects of the present invention comprise the features detailed below and specified particularly in the claims. Some exemplary aspects of the present invention are described in details by the description below and the accompanying drawings. However, these aspects only indicate some implementations of various implementations of the present invention. In addition, the present invention is intended to include all these aspects and their equivalents.

BRIEF DESCRIPTION OF THE DRAWINGS

By referring to the description and the claims in conjunction with the drawings, and with a full understanding of the present invention, other objects and results of the present invention will be more clearly and easily understood. In the drawings:

Figure 1:
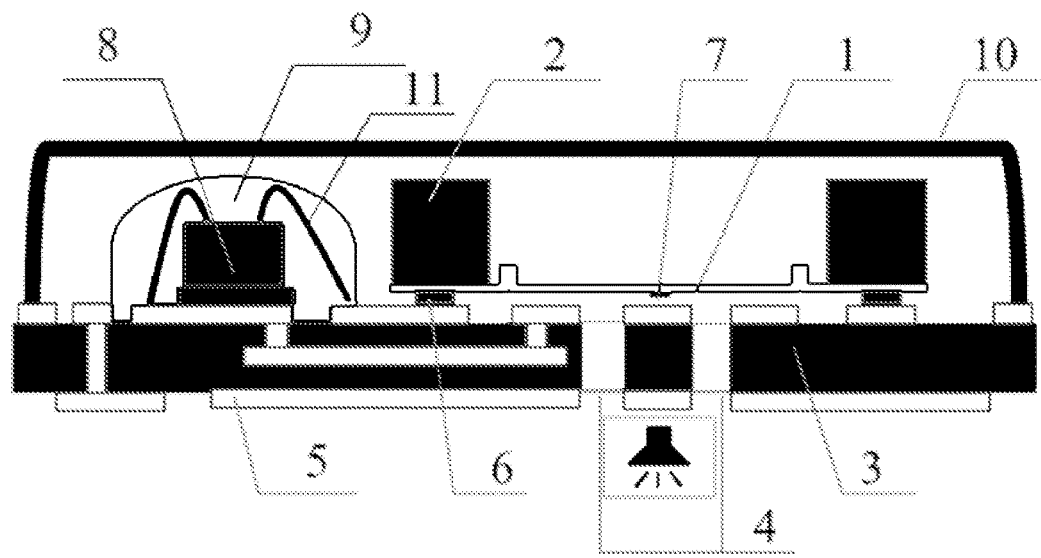
FIG. 1 is a schematic view illustrating a first plane structure of the silicon speaker according to a first embodiments of the present invention.

In the drawings: 1. corrugated diaphragm; 2. silicon substrate; 3. PCB substrate; 4. through hole; 5. metal paths; 6. metalized side surface; 7. dielectric protrusion; 8. IC driver; 9. flip-chip; 10. sealing cover; 11. leading wire.

DETAILED DESCRIPTION OF THE EMBODIMENTS

Throughout the figures, similar signs indicate similar or corresponding features or functions.

In the following, particular embodiments of the present invention are described in connection with the accompanying drawings.

In order to address technical problems in the prior speaker such as high production cost and poor sounding effect, the present invention adopts a high-aspect-ratio corrugated diaphragm on Si substrate with metal pattern, this has greatly simplified the manufacturing process of the MEMS acoustoelectric chip. Meanwhile, as the silicon substrate is relatively small, light, cheap and easy to be integrated with ICs and the corrugated diaphragm with high-aspect-ratio corrugation is capable of eliminating the stress of the diaphragm, the silicon speaker provided by the present invention can lower manufacturing costs of the speaker, and allows the diaphragm to generate high and repeatable/reliable sound pressure upon large displacements so as to improve the sounding effects of the speaker.

In order to explain the silicon speaker provided by the present invention, FIG. 1 illustrates the first plane structure of the silicon speaker according to a first embodiment of the present invention.

As illustrated in FIG. 1, the silicon speaker provided by the present invention comprises an MEMS (Micro-Electro-Mechanical-System) acoustoelectric chip and a PCB (Printed Circuit Board) substrate 3, wherein the MEMS acoustoelectric chip is configured for performing acoustoelectric conversion, and comprises a corrugated diaphragm 1 on a silicon substrate 2. Specifically, the corrugated diaphragm 1 is positioned between the PCB substrate 3 and the silicon substrate 2.

It is to be noted that, as the diaphragm may generate some stress during vibration and/or after packaging, the corrugation in diaphragm can eliminate the stress generated in the diaphragm in vibration and/or in packaging. This can help the diaphragm in large displacement for high sound pressure level operation, and can improve reliability and life time as well.

The corrugated diaphragm 1 may have high-aspect-ratio corrugation for stress relief.

The MEMS acoustoelectric chip is metalized at one side surface through metal deposition and patterning, and the metalized side surface 6 of the MEMS acoustoelectric chip is connected with the PCB substrate 3. In that manner, the metalized side surface 6 functions as electrical conduction, which allows electrical power to be conducted to the MEMS acoustoelectric chip through the PCB substrate 3, enabling diaphragm 1 to vibrate.

Further, the PCB substrate 3 is provided with at least one through hole 4 and metal paths 5 thereon. Also, the PCB substrate is provided with an IC driver 8 and/or a flip-chip 9, wherein the metalized side surface 6 of the MEMS acoustoelectric chip is connected with the metal paths 5 positioned on the PCB substrate. In that manner, the MEMS acoustoelectric chip can perform acoustoelectric conversion while driven by the integrated circuit 8 and/or the flip-chip 9.

It is to be noted that the IC driver 8 and the flip-chip 9, which functions as driving the silicon speaker, can be used separately or cooperatively. Wherein, when the IC driver 8 is used separately, leading wires 11 are required to connect the IC driver 8 with the metal paths 5 positioned on the PCB substrate 3; and when the flip-chip 9 is used separately, it is only needed to flip-chip mount the flip-chip 9 on the PCB substrate 3.

Additionally, in order to prevent the corrugated diaphragm 1 of the MEMS acoustoelectric chip from adhering or electrically shorting to the metal paths 5 positioned on the PCB substrate 3 when the metalized side surface 6 of the MEMS acoustoelectric chip is vibrating, a dielectric protrusion 7 is provided at the center of the wave-shaped diaphragm 1 of the MEMS acoustoelectric chip.

Further, the abovementioned silicon speaker also comprises a sealing cover 10. Wherein, the sealing cover 10 is attached onto the PCB substrate 3. At this point, the sealing cover 10 and the PCB substrate 3 form the back chamber of the silicon speaker. When the sealing cover 10 and the PCB substrate 3 form the back chamber of the silicon speaker, the opening for transmitting sounds of the silicon speaker is provided at the bottom of the silicon speaker. That is, the through hole 4 positioned on the PCB substrate 3 now can serve as the opening for transmitting sounds of the silicon speaker.

Also, when the sealing cover 10 and the PCB substrate 3 form a front chamber of the silicon speaker, the opening for transmitting sounds of the silicon speaker is provided at the top of the silicon speaker or on the side surface thereof on the sealing cover. Wherein, FIG. 2 illustrates the second plane structure of the silicon speaker according to a second embodiment of the present invention.

Figure 2:
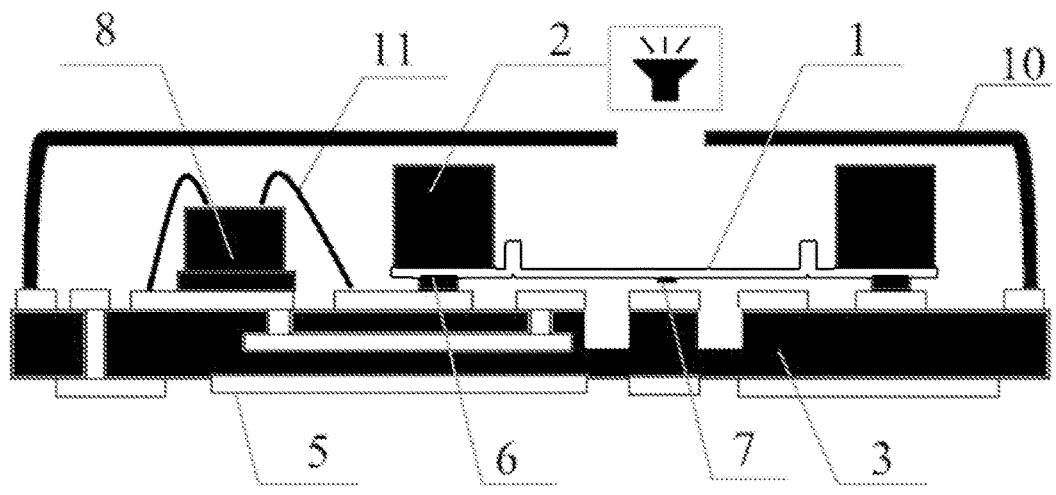
FIG. 2 is a schematic view illustrating a second plane structure of the silicon speaker according to a second embodiments of the present invention.

As illustrated in FIG. 2, the silicon speaker provided by the present invention comprises an MEMS acoustoelectric chip and a PCB substrate 3, wherein the MEMS acoustoelectric chip is configured for performing acoustoelectric conversion, and comprises a corrugated diaphragm 1 and a silicon substrate 2.

The MEMS acoustoelectric chip is metalized at one side surface through metal spraying, and the metalized side surface 6 of the MEMS acoustoelectric chip is connected with the PCB substrate 3. In that manner, the metalized side surface 6 of the MEMS acoustoelectric chip functions as electrical conduction, which allows electrical power to be conducted to the MEMS acoustoelectric chip through the PCB substrate 3, enabling the wave-shaped diaphragm 1 to vibrate.

Further, the PCB substrate 3 is provided with metal paths 5 thereon. Also, the PCB substrate is further provided with an IC driver 8, wherein the metalized side surface 6 of the MEMS acoustoelectric chip is connected with the metal paths 5 positioned on the PCB substrate 3 by the leading wires 11. In that manner, the MEMS acoustoelectric chip can perform acoustoelectric conversion while driven by the IC driver 8.

Additionally, in order to prevent the metalized side surface of the MEMS acoustoelectric chip from adhering or electrically shorting to the metal paths 5 positioned on the PCB substrate 3 while vibrating, a dielectric protrusion 7 is provided at the center of the wave-shaped diaphragm 1 of the MEMS acoustoelectric chip.

Further, the abovementioned silicon speaker also comprises a sealing cover 10. Wherein, the sealing cover 10 is attached onto the PCB substrate 3. At this point, the sealing cover 10 and the PCB substrate 3 form a front chamber of the silicon speaker, and the opening for transmitting sounds of the silicon speaker is provided at the top of the silicon speaker.

Figure 3:
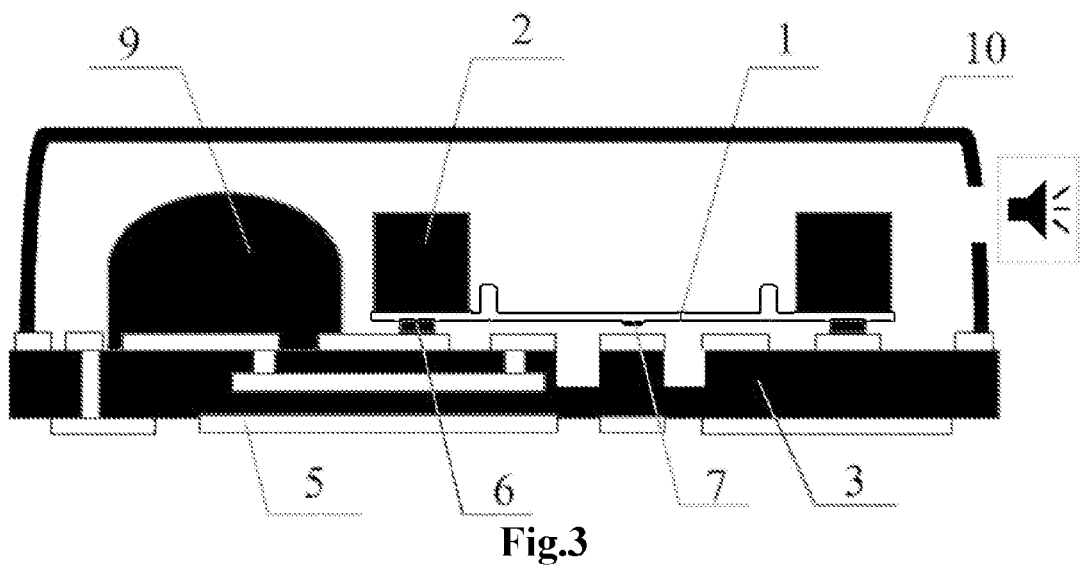
FIG. 3 is a schematic view illustrating a third plane structure of the silicon speaker according to a third embodiments of the present invention.

Further, FIG. 3 illustrates the third plane structure of the silicon speaker according to a third embodiment of the present invention. As illustrated in FIG. 3, the silicon speaker provided by the present invention comprises an MEMS acoustoelectric chip and a PCB substrate 3, wherein the MEMS acoustoelectric chip is configured for performing acoustoelectric conversion, and comprises a corrugated diaphragm 1 and a silicon substrate 2.

The MEMS acoustoelectric chip is metalized at one side surface through metal spraying, and the metalized side surface of the MEMS acoustoelectric chip is connected with the PCB substrate 3. In that manner, the metalized side surface of the MEMS acoustoelectric chip functions as electrical conduction, which allows electrical power to be conducted to the MEMS acoustoelectric chip through the PCB substrate 3, enabling the corrugated diaphragm 1 to vibrate.

Further, the PCB substrate 3 is provided with metal paths 5 thereon. Also, the PCB substrate is provided with a flip-chip 9 which is flip-chip mounted on the PCB substrate 3, wherein the metalized side surface 6 of the MEMS acoustoelectric chip is connected with the metal paths 5 positioned on the PCB substrate. In that manner, the MEMS acoustoelectric chip can perform acoustoelectric conversion while driven by the flip-chip 9.

Additionally, in order to prevent the metalized side surface of the MEMS acoustoelectric chip from adhering or electrically shorting to the metal paths 5 positioned on the PCB substrate 3 while vibrating, a dielectric protrusion 7 is provided at the center of the corrugated diaphragm 1 of the MEMS acoustoelectric chip.

Further, the abovementioned silicon speaker also comprises a sealing cover 10. Wherein, the sealing cover 10 is attached onto the PCB substrate 3. At this point, the sealing cover 10 and the PCB substrate 3 form a front chamber of the silicon speaker, and the opening for transmitting sounds of the silicon speaker is provided on the side surface of the silicon speaker on the sealing cover.

As can be seen from the structures illustrated in FIG. 1 to FIG. 3, the silicon speaker provided by the present invention adopts a corrugated diaphragm, and the silicon substrate is etched so as to be positioned around all edge of the corrugated diaphragm, one side surface of the MEMS acoustoelectric chip is metalized, and the metalized side surface of the MEMS acoustoelectric chip is connected with the PCB substrate, simplifying the manufacturing process of the MEMS acoustoelectric chip so as to allow the diaphragm to generate high and repeatable/reliable sound pressure upon large displacements thereby improving the sounding effects of the speaker, while the manufacturing cost of the speaker is lowered.

As described above, the silicon speaker of the present invention is illustrated by way of example with reference to the accompanying drawings. However, it should be understood by those skilled in the art that various improvements can be made to the silicon speaker provided by the present invention as described above without departing from the spirit of the present invention. Accordingly, the scope of protection of the present invention should be defined by the appended claims.

The invention claimed is:

1. A silicon speaker comprising an MEMS acoustoelectric chip and a PCB substrate, wherein
the MEMS acoustoelectric chip comprises a silicon substrate and a corrugated diaphragm provided at one side of the silicon substrate,
the corrugated diaphragm is provided between the PCB substrate and the silicon substrate,
metal paths are provided on the PCB substrate,
a portion of a surface of the corrugated diaphragm, which surface faces the PCB substrate is metalized through metal deposition and patterning, and the metalized portion is in contact with the metal paths on the PCB substrate, and
a portion of the metal paths are on an opposite side of a space from the corrugated diaphragm.

2. The silicon speaker according to claim 1, wherein a dielectric protrusion is provided at the center of the corrugated diaphragm.

3. The silicon speaker according to claim 1, wherein the corrugated diaphragm has at least one layer of conductive material therein.

4. The silicon speaker according to claim 1, wherein the MEMS acoustoelectric chip is flip-chip mounted on the PCB substrate with flux-less process.

5. The silicon speaker according to claim 1, wherein the PCB substrate is provided with an IC driver and/or a flip-chip thereon.

6. The silicon speaker according to claim 1, further comprising a sealing cover which is attached onto the PCB substrate.

7. The silicon speaker according to claim 6, when the sealing cover and the PCB substrate form a front chamber of the silicon speaker, an opening for transmitting sounds of the silicon speaker is provided at the top of the silicon speaker or on a side surface of the silicon speaker on the sealing cover.

8. The silicon speaker according to claim 6, wherein at least one through hole is provided on the PCB substrate and the through hole is the opening for transmitting sounds of the silicon speaker.

9. The silicon speaker according to claim 8, when the sealing cover and the PCB substrate form a back chamber of the silicon speaker, the opening is provided at the bottom of the silicon speaker.

* * * * *